United States Patent
Morimoto et al.

[11] Patent Number: 6,097,040
[45] Date of Patent: Aug. 1, 2000

[54] SEMICONDUCTOR LIGHT EMITTING DEVICE THAT PREVENTS CURRENT FLOW IN A PORTION THEREOF DIRECTLY UNDER AN ELECTRODE WIRE BONDING PAD

[75] Inventors: Taiji Morimoto, Nara; Shigetoshi Ito, Ikoma, both of Japan

[73] Assignee: Sharp Kabushiki Kaisha, Osaka, Japan

[21] Appl. No.: 09/115,756

[22] Filed: Jul. 15, 1998

[30] Foreign Application Priority Data

Jul. 23, 1997 [JP] Japan ...................................... 9-196790

[51] Int. Cl.[7] .................................................. H01L 33/00

[52] U.S. Cl. ................................................ 257/91; 257/99

[58] Field of Search ................................. 257/81, 91, 99, 257/745, 93

[56] References Cited

U.S. PATENT DOCUMENTS 5,093,697 3/1992 Satoh ........................................ 257/91
5,600,363 2/1997 Anzaki et al. ........................... 347/237

FOREIGN PATENT DOCUMENTS 07094782 7/1995 Japan.
3027676 5/1996 Japan.
08274377 10/1996 Japan.
10-135519 5/1998 Japan.

*Primary Examiner*—Minh Loan Tran

[57] ABSTRACT

A semiconductor light emitting device includes an insulating substrate; and a layered structure formed on the insulating substrate, the layered structure including at least a light emitting section, a positive electrode section, and a negative electrode section. A portion of the positive electrode section and a portion of the negative electrode section overlap each other via an insulating film.

14 Claims, 3 Drawing Sheets

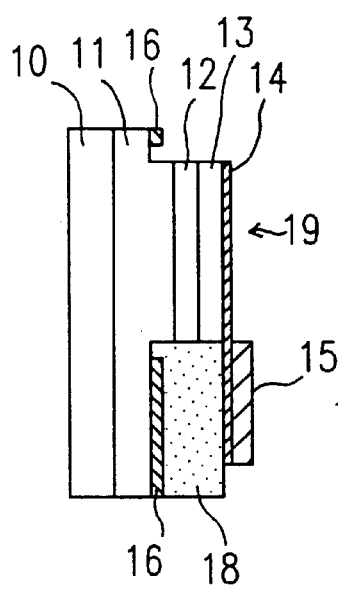
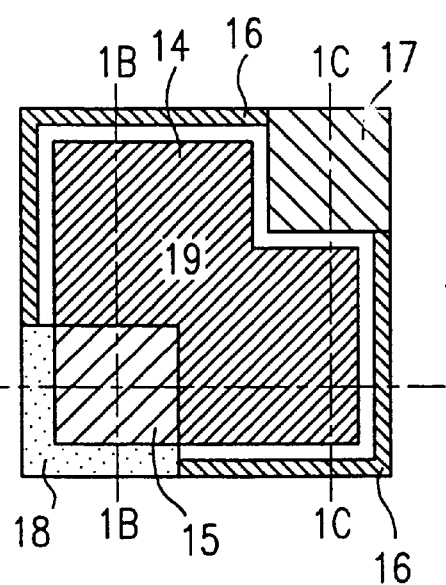
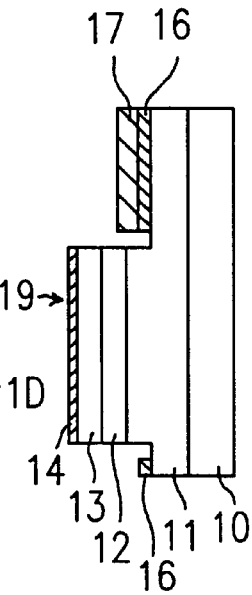
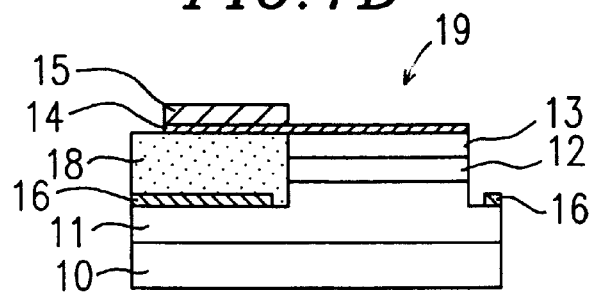

SEMICONDUCTOR LIGHT EMITTING DEVICE THAT PREVENTS CURRENT FLOW IN A PORTION THEREOF DIRECTLY UNDER AN ELECTRODE WIRE BONDING PAD

BACKGROUND OF THE INVENTION

1. Field of the Invention

The present invention relates to a semiconductor light emitting device, and specifically, a semiconductor light emitting device having a specific electrode structure. More particularly, the present invention relates to a structure, shape and arrangement of electrode pads of a semiconductor light emitting device formed on an insulating substrate.

2. Description of the Background Art

A semiconductor light emitting device (LED device) which provides light emissions ranging from a visible light region to an ultraviolet region has been realized using a nitride-type semiconductor material such as a mixed crystal of GaN, AlN or InN. In such an LED device, sapphire or the like is typically used as a growth substrate. Since such a substrate is an insulating substrate, a positive electrode and a negative electrode have to be provided on the growth surface side of the device. Various structures for the above purpose have been proposed.

Hereinafter, a conventional semiconductor light emitting device disclosed in Japanese Laid-open Publication No. 7-94782 which uses a nitride semiconductor material will be described.

FIG. 3A is a plan view illustrating the conventional gallium nitride-type compound semiconductor light emitting device, and FIG. 3B is a schematic cross-sectional view along line 3B—3B in the plan view of FIG. 3A.

Referring to FIG. 3B, an n-type gallium nitride-type compound semiconductor layer 31 and a p-type gallium nitride-type compound semiconductor layer 33 are deposited in this order for light generation on an insulating substrate 30 such as a sapphire substrate.

A negative electrode section including a negative electrode wire bonding pad 32 is formed on the n-type gallium nitride-type compound semiconductor layer 31. A positive electrode section including a positive electrode wire bonding pad 34 and a light transmissive electrode layer 35 is formed on the p-type gallium nitride-type compound semiconductor layer 33. The light transmissive electrode layer 35 for current diffusion is formed substantially over the entire surface of the p-type gallium nitride-type compound semiconductor layer 33. A window section 36 is provided in the light transmissive electrode layer 35, through which the positive electrode wire bonding pad 34 contacts the p-type gallium nitride-type compound semiconductor layer 33.

In the plan view of FIG. 3A, the positive electrode wire bonding pad 34 in the positive electrode section and the negative electrode wire bonding pad 32 in the negative electrode section are provided at opposing corners of the device.

Another conventional device employing a similar positive/negative electrode structure is disclosed in Japanese Laid-open Publication No. 8-274377.

The light emitting devices of the above-described type are usually mounted with the electrode surface facing up so that light may be radiated through the transparent electrode. However, the positive electrode wire bonding pad 34 in the positive electrode section illustrated in FIGS. 3A and 3B is non-transmissive since the pad 34 is typically formed using a metal film too thick to transmit light therethrough. Thus, light generated in a portion of a light emitting layer (i.e., the layers 31 and 33) under the positive electrode wire bonding pad 34 cannot be effectively output.

Thus, in the conventional structure as set forth above, only the current flowing through a portion of the light transmissive electrode layer 35 which is not covered by the positive electrode wire bonding pad 34 contributes to the optical output of the device illustrated in FIGS. 3A and 3B. In other words, the current flowing into a portion under the positive electrode wire bonding pad 34 has no or little contribution to the effective light emission of the device in FIGS. 3A and 3B.

SUMMARY OF THE INVENTION

A semiconductor light emitting device of the present invention includes: an insulating substrate; and a layered structure formed on the insulating substrate, the layered structure including at least a light emitting section, a positive electrode section, and a negative electrode section. A portion of the positive electrode section and a portion of the negative electrode section overlap each other via an insulating film.

In one embodiment, a first wire bonding pad provided for the positive electrode section and a second wire bonding pad provided for the negative electrode section are formed in a vicinity of each other along the same side of the insulating substrate.

In the conventional semiconductor light emitting device, the internal light emission generated directly under an electrode wire bonding pad is blocked by the electrode wire bonding pad, and thus does not contribute to the optical output of the device. In contrast, in the semiconductor light emitting device of the present invention, a current is prevented from flowing into a portion directly under an electrode wire bonding pad for one electrode section by the provision of an insulating layer. Therefore, the amount of current which is less likely to contribute to the optical output of the resultant semiconductor light emitting device is reduced, and the light emission efficiency thereof is improved. Moreover, since a contact area for the other electrode section increases, it is possible to reduce the forward voltage (the operation voltage) of the resultant semiconductor light emitting device.

Furthermore, by forming the light emitting section in a simple shape such as a rectangular, a simple light emission pattern of the resultant semiconductor light emitting device can be obtained.

Thus, the invention described herein makes possible the advantage of providing a semiconductor light emitting device having a reduced operation voltage and an increased optical output.

The advantages of the present invention will become apparent to those skilled in the art upon reading and understanding the following detailed description with reference to the accompanying figures.

BRIEF DESCRIPTION OF THE DRAWINGS

FIGS. 1A to 1D illustrate a structure of a semiconductor light emitting device according to Example 1 of the present invention, where FIG. 1A is a plan view of the device, and FIGS. 1B, 1C and 1D are cross-sectional views along line 1B—1B, line 1C—1C, and line 1D—1D in FIG. 1A, respectively.

FIG. 2A is a plan view of the device, and FIGS. 2B, 2C and 2D are cross-sectional views along line 2B—2B, line 2C—2C, and line 2D—2D in FIG. 2A, respectively.

FIG. 3A is a plan view of the device, and FIG. 3B is a schematic cross-sectional view along line 3B—3B in FIG. 3A.

DESCRIPTION OF THE PREFERRED EMBODIMENTS

Figure 2B:
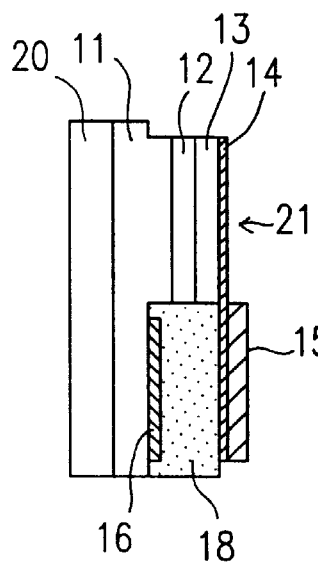
FIGS. 2A to 2D illustrate a structure of a semiconductor light emitting device according to Example 2 of the present invention, where

FIGS. 1A to 1D and 2A to 2D each relate to an example of the present invention. Hereinafter, the examples of the present invention will be described with reference to the figures.

EXAMPLE 1

FIGS. 1A to 1D illustrate a structure of a semiconductor light emitting device according to Example 1 of the present invention, where FIG. 1A is a plan view of the device, and FIGS. 1B, 1C and 1D are schematic cross-sectional views of FIG. 1A. Specifically, FIGS. 1B, 1C and 1D are cross-sectional views along line 1B—1B, line 1C—1C, and line 1D—1D in FIG. 1A, respectively.

The light emitting device of the present example includes: a sapphire substrate 10 (a square shape having an area of about 350 μm by about 350 μm), a light emitting section 19 (basically a square shape having an area of about 300 μm by about 300 μm, with two indents), a positive electrode wire bonding pad 15 for a positive electrode section, and a negative electrode wire bonding pad 17 for a negative electrode section. The positive and negative electrode wire bonding pads 15 and 17 (each formed in a square shape having an area of about 130 μm by about 130 μm) are, provided at opposing corners of the sapphire substrate 10.

In FIGS. 1B, 1C and 1D, an n-type $Al_XGa_YIn_{1-X-Y}N$ layer ($0 \leq X \leq 1$ and $0 \leq Y \leq 1$) 11 is provided on the sapphire substrate 10. An $Al_ZGa_TIn_{1-Z-T}N$ layer ($0 \leq Z \leq 1$ and $0T \leq 1$) 12 as a light emitting layer and a p-type $Al_UGa_VIn_{1-U-V}N$ layer ($0 \leq U \leq 1$ and $0 \leq V \leq 1$) 13 are then provided on the n-type $Al_XGa_YIn_{1-X-Y}N$ layer 11, so that a portion of the surface of the layer 11, which is substantially parallel to the sapphire substrate 10, is partially not covered with the layers 12 and 13. The light emitting layer 12 may be a non-doped, or Si-doped, $Al_ZGa_TIn_{1-Z-T}N$ layer.

A negative electrode 16 is provided on the portion of the n-type $Al_XGa_YIn_{1-X-Y}N$ layer 11 which is not covered with the layers 12 and 13. The negative electrode wire bonding pad 17 is further provided on a portion of the negative electrode 16.

An insulating layer 18 is provided on a portion of the negative electrode 16 and/or the negative electrode wire bonding pad 17 for insulation from a positive electrode 14 which is formed in a subsequent step. The insulating film may be formed using, for example, an $SiO_2$ film, an $SiN_X$ film, a $TiO_2$ film, or the like. The insulating film may be formed by using a sputtering deposition method or an electron beam deposition method. An SOG (Spin On Glass) method may also be used.

After the formation of the insulating layer 18, unnecessary portions of the layer 18 which are not required for preventing the shortcircuiting between the negative electrode 16 and the positive electrode 14 are removed using photolithography and etching processes.

The insulating layer 18 has a thickness sufficient for realizing electrical insulation between the negative electrode 16 and the positive electrode 14, which is typically about 0.2 μm or greater.

Specific examples of the electrode material for the negative electrode (n-type electrode) 16 may include a Ti/Al layered electrode, or an Al single layer film, for example.

The positive electrode 14 is formed on the p-type $Al_UGa_VIn_{1-U-V}N$ layer 13 and the insulating layer 18. The positive electrode (p-type transparent electrode) 14 is transparent, and may be obtained by depositing a thin Au film on a metal layer of one or more of Ni, Pd, Pt, and the like, or it may be a layer formed solely of Ni, Pd, or Pt. Moreover, it may also be obtained by depositing a transparent electrode of ITO or TiN on a thin layer made of Ni, Pd, or Pt. The thickness of the electrode metal layer of the positive electrode 14 is set so as to block as little of the internal light emission of the device as possible while maintaining the conductivity. Specifically, the thickness can be about 1 nm to about 100 nm.

The positive electrode wire bonding pad 15 is further formed on a portion of the positive electrode 14 directly above the insulating layer 18. The positive electrode wire bonding pad 15 is formed using a material of a type similar to that of the positive electrode 14 in view of the production process, but with an Au layer provided on the surface thereof. Therefore, the layered structure of the resultant positive electrode wire bonding pad 15 may include, from top to bottom, Au/(Ni, Pd, Pt)/p-GaN. A total thickness of the positive electrode wire bonding pad 15 is typically about 0.1 μm to about 2 μm.

The structure of Figures 1A–1D, where a part of the negative electrode 16 is buried to exist directly under the positive electrode wire bonding pad 15 via the insulating layer 18, provides the following advantages.

It is possible to eliminate a portion of the current, which is less likely to contribute to the optical output of the light emitting device, from the current flowing directly under a main portion of the positive electrode wire bonding pad 15 overlapping the light emitting layer 12, while increasing the contact area between the n-type $Al_XGa_YIn_{1-X-Y}N$ layer 11 and the negative electrode 16. As a result, it is possible to reduce the operation voltage required for the light emission and improve the external emission efficiency of the resultant semiconductor light emitting device.

Specifically, when the sapphire substrate 10 used has an area of about 350 μm by about 350 μm, for example, the area of the positive and negative wire bonding pads 15 and 17 is each about 130 μm by about 130 μm, and the area of the light emitting section 19 is about 300 to 320 μm by 300 to 320 μm subtracted by the area overlapping with the positive and negative electrode pads 15 and 17. Furthermore, the area of the main portion of the positive electrode wire bonding pad 15 overlapping the light emitting layer 12 is about 100 μm by about 100 μm.

EXAMPLE 2

Figure 2A:
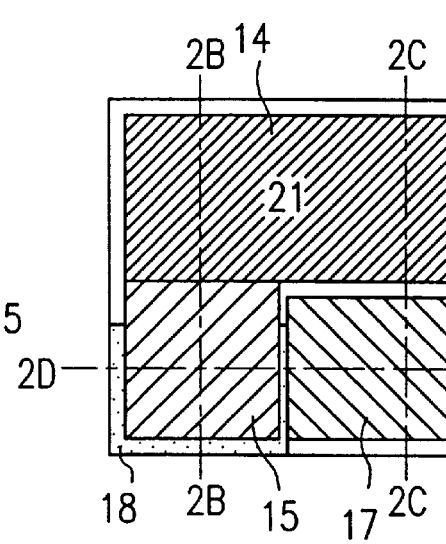
Figure 2C:
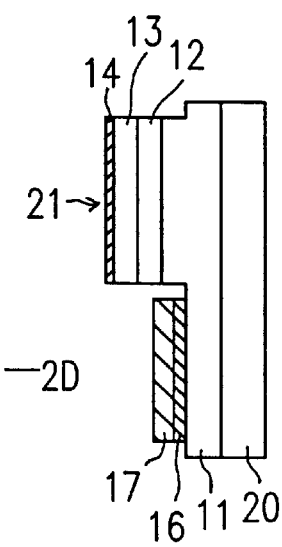
Figure 2D:
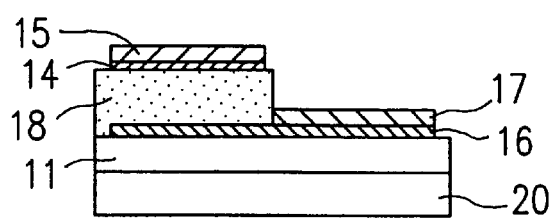
Figure 3A:
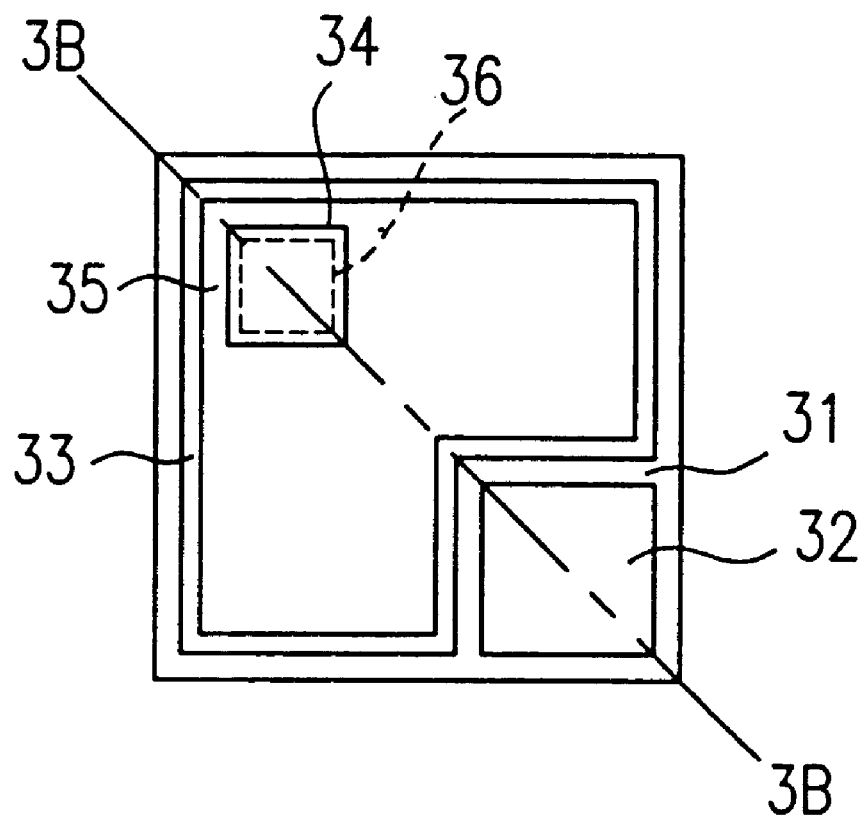
FIGS. 3A and 3B illustrate a conventional gallium nitride-type compound semiconductor light emitting device using a nitride-type semiconductor material, where
Figure 3B:
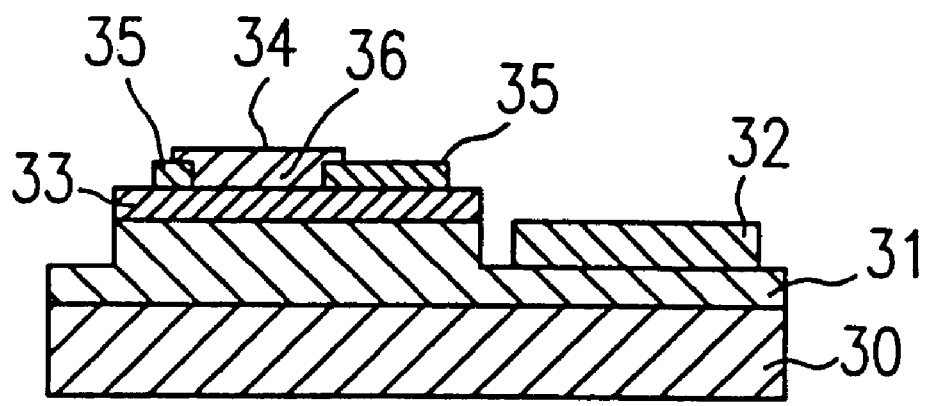

FIGS. 2A to 2D illustrate a structure of a light emitting device according to Example 2 of the present invention, where a light emitting section 21 (a light emitting layer 12) is formed in a rectangular shape. FIG. 2A is a plan view of the device, and FIGS. 2B, 2C and 2D are schematic cross-sectional views of FIG. 2A. Specifically, FIGS. 2B, 2C and 2D are cross-sectional views along line 2B—2B, line 2C—2C, and line 2D—2D in FIG. 2A, respectively. Like constituent elements in Figures 1A–1D and 2A–2D are designated by like reference numerals, and the descriptions thereof will be omitted herein.

The light emitting device of the present example includes: a sapphire substrate 20 (a square shape having an area of about 350 μm by about 350 μm), a light emitting section 21 (a rectangular shape having an area of about 300 μm by about 170 μm), a positive electrode wire bonding pad 15 for a positive electrode section and a negative electrode wire bonding pad 17 for a negative electrode section. The positive and negative electrode wire bonding pads 15 and 17 (each formed in a square shape having an area of about 130 μm by about 130 μm) are provided in the vicinity of each other along the same side of the sapphire substrate 20.

As in Example 1, a part of the negative electrode 16 in this example is buried to partially exist directly under the positive electrode wire bonding pad 15 via the insulating layer 18, thereby providing the following advantages.

It is possible to eliminate a portion of the current flowing directly under the positive electrode wire bonding pad 15, which is less likely to contribute to the optical output of the light emitting device, while realizing an increased contact area between the n-type $Al_XGa_YIn_{1-X-Y}N$ layer 11 and the negative electrode 16. Specifically, the contact area of the negative electrode 16 in this example is about 1.8 times as large as that of the conventional example; that is, the contact area is increased from about 150 μm by about 130 μm in the conventional example to about 150 μm by about 130 μm plus about 150 μm by about 100 μm in the present example. Accordingly, the operation voltage is reduced by about 0.05 V to about 0.1 V, i.e., from about 3.5 V in the conventional example to about 3.4 V to about 3.45 V in the present example (a voltage value for a forward current of about 20 mA). Furthermore, the optical output is increased by about 2% to about 5%.

In addition, by providing the positive and negative electrode wire bonding pads 15 and 17 along one side of the sapphire substrate 20, it is possible to form the light emitting section 21 in a simple polygonal shape. Therefore, using such a light emitting device, it is possible to easily obtain a light emitting apparatus which has emission characteristics with less non-uniformity.

As described above, according to the present invention, the semiconductor light emitting device includes an insulating substrate and a layered structure formed on the insulating substrate, and the layered structure including at least a light emitting section, a positive electrode section, and a negative electrode section. A portion of the positive electrode section and a portion of the negative electrode section overlap each other via an insulating film. With such a structure, it is possible to reduce the current flowing directly under a portion of one of the electrode sections, which is less likely to contribute to the optical output of the light emitting device, while increasing the contact area for the other one of the electrode sections. As a result, it is possible to improve the optical output and reduce the operation voltage of the resultant semiconductor light emitting device.

Furthermore, according to the present invention, it is also possible to provide a (first) wire bonding pad for the positive electrode section and another (second) wire bonding pad for the negative electrode section so as to be formed in a vicinity of each other along the same side of the insulating substrate. With such a structure, the light emitting section has a simple shape, so that the emission pattern obtained is not complicated, different from a pattern having indents, for example. Therefore, upon incorporation of the semiconductor light emitting device into a light emitting apparatus such as a lamp, it is possible to obtain a light emitting apparatus having simple emission characteristics.

Moreover, it is possible to increase the contact area of the negative electrode with the n-type layer (e.g., the n-type $Al_XGa_YIn_{1-X-Y}N$ layer). As a result, it is possible to reduce the operation voltage and increase the optical output of the resultant semiconductor light emitting device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:
   an insulating substrate;
   a layered structure formed on the insulating substrate, the layered structure including at least a light emitting section, a positive electrode section, and a negative electrode section, the positive and negative electrode sections being provided on upper surfaces of the layered structure; and
   an insulating film disposed between a portion of the positive electrode section and a portion of the negative electrode section that overlap each other.

2. The semiconductor light emitting device according to claim 1, wherein a first wire bonding pad provided for the positive electrode section and a second wire bonding pad provided for the negative electrode section are formed in a vicinity of each other along a same side of the insulating substrate.

3. The semiconductor light emitting device according to claim 1, wherein a first wire bonding pad provided for the positive electrode section and a second wire bonding pad provided for the negative electrode section are formed in respective areas diagonally opposite on the insulating substrate.

4. The semiconductor light emitting device of claim 1, wherein the light emitting section comprises respective first and second layers of opposite conductivity type, the positive electrode section being formed on the first layer and the insulating film, and the negative electrode section being formed on the second layer.

5. The semiconductor light emitting device of claim 4, wherein the second layer includes a sublayer, the negative electrode section being formed on the sublayer.

6. A semiconductor light emitting device, comprising:
   an insulating substrate; and
   a layered structure formed on the insulating substrate, the layered structure including at least a light emitting section, a positive electrode section, and a negative electrode section,
   wherein a portion of the positive electrode section and a portion of the negative electrode section overlap each other via an insulating film,
   a first wire bonding pad provided for the positive electrode section and a second wire bonding pad provided for the negative electrode section are formed in a vicinity of each other along a same side of the insulating substrate.

7. A semiconductor light emitting device comprising:
   an insulating substrate;
   a light emitting structure, formed on said insulating substrate, having first and second layers;

a positive electrode section formed on the first layer;

a negative electrode section formed on the second layer; and an insulating film disposed between a portion of said positive electrode section that overlaps a portion of said negative electrode section.

8. The semiconductor light emitting device of claim 7, further comprising a first wire bonding pad formed on the portion of said positive electrode section that overlaps the portion of said negative electrode section.

9. The semiconductor light emitting device of claim 8, further comprising a second wire bonding pad formed on said negative electrode section.

10. The semiconductor light emitting device of claim 9, wherein said first and second wire bonding pads are formed in a vicinity of each other along a same side of said insulating substrate.

11. The semiconductor light emitting device of claim 9, wherein said first and second wire bonding pads are formed in respective areas diagonally opposite on said insulating substrate.

12. The semiconductor light emitting device of claim 7, wherein the second layer includes a sublayer, said negative electrode section being formed on the sublayer.

13. The semiconductor light emitting device of claim 7, wherein the first and second layers are of opposite conductivity type.

14. The semiconductor light emitting device of claim 7, wherein said positive and negative electrode sections are formed on upper surfaces of said light emitting structure.

\* \* \* \* \*